United States Patent [19]
Berrian et al.

[11] Patent Number: 5,996,528
[45] Date of Patent: Dec. 7, 1999

[54] METHOD AND APPARATUS FOR FLOWING GASES INTO A MANIFOLD AT HIGH POTENTIAL

[75] Inventors: Donald W. Berrian, Topsfield; Robert Kaim, Brookline; John D. Pollock, Rowley, all of Mass.

[73] Assignee: Novellus Systems, Inc., San Jose, Calif.

[21] Appl. No.: 08/674,444

[22] Filed: Jul. 2, 1996

[51] Int. Cl.⁶ .............................. C23C 16/00; C23F 1/02
[52] U.S. Cl. ................. 118/723 E; 156/345; 204/298.07
[58] Field of Search ........................ 156/345; 118/723 E; 204/298.07; 427/569

[56] References Cited

U.S. PATENT DOCUMENTS

| | | | |
|---|---|---|---|
| 4,496,423 | 1/1985 | Walton | 156/345 |
| 4,595,452 | 6/1986 | Landau et al. | 156/643 |
| 5,273,588 | 12/1993 | Foster et al. | 118/723 E |

FOREIGN PATENT DOCUMENTS 0 565 259 A1   10/1993   European Pat. Off. .

*Primary Examiner*—Bruce Breneman
*Assistant Examiner*—Alva C Powell
*Attorney, Agent, or Firm*—Duft, Graziano & Forest, PC; Curtis A. Vock, Esq.

[57] ABSTRACT

A reactor for plasma CVD or plasma etch is provided with a first electrode held to ground potential which supports the workpiece, e.g., a semiconductor wafer. A second electrode is spaced from the first electrode to form a gap therebetween, and has an electrical potential suitable to form an ionizing electrical field within the gap. The second electrode also has a gas inlet and a gas outlet. Preferably, the gas outlet includes a plurality of gas outlets. The reactor includes a porous plug constructed and arranged with the gas inlet to isolate the second electrode from ground potential. This plug has a plurality of pores which are sized to permit passage of gas therethrough and to substantially inhibit electrical discharge therein. Accordingly, gas injected through the gas inlet of the second electrode passes through the plug without ionization; and that gas thereafter exits from the gas outlet to provide substantially uniform ionization within the gap. Multiple gases and porous plugs can be used in tandem to mix and provide uniform plasma generation. A metal tube, substantially at ground potential, connects directly to the reactor and adjacent to the porous plug to provide a sturdy conduit for gases injected into the reactor and into regions of high potential.

5 Claims, 8 Drawing Sheets

METHOD AND APPARATUS FOR FLOWING GASES INTO A MANIFOLD AT HIGH POTENTIAL

BACKGROUND OF THE INVENTION

It is well-known that the processes of plasma chemical vapor deposition, or plasma "CVD," and plasma etch occur within a reactor. One exemplary prior art reactor is described in U.S. Pat. No. 5,273,588, entitled "Semiconductor wafer processing reactor apparatus comprising contoured electrode gas directing means." Typically, the reactor of the prior art has a pair of electrodes and a radiofrequency source which, in combination, generate a discharge between the electrodes to ionize reactive gases therein. These ionized gases form a "plasma" which deposits film onto, or etches film off of, surfaces in contact with the plasma.

In plasma CVD, for example, a workpiece, e.g., a semiconductor wafer, is clamped to one of the electrodes so that selected films can be deposited onto the workpiece's surface(s) exposed to the plasma between the electrodes. Successive exposures to differing plasmas can create desirable semiconductor films on the surface, such as a bilayer of titanium and titanium-nitride. Similarly, in plasma etch, coatings or films can be removed selectively when exposed to plasmas formed by appropriate etch gases, e.g.,carbon tetrafluoride.

Typically, the electrical discharges which transform the reactive gases into plasma are generated by applying differential voltages to the electrodes. These discharges are usually radiofrequency ("RF"), as generated by an alternating current ("AC") RF source connected to the electrodes. A low-frequency, direct current ("DC") source can also be used to create plasma by generating an ionizing "spark" within the gap between the two electrodes.

To facilitate the application of AC and/or DC voltage differentials to the electrodes, one of the electrodes is usually grounded and the other is held at potential, i.e., at high voltage. The workpiece can be connected, mounted or clamped to either electrode so that at least one surface of the workpiece receives the desired process of film deposition or etch. However, because it is often desirable to heat the workpiece during the plasma CVD or etch process, one of the electrodes also generally functions as a heated carrier. This additional process of controlling electrode temperatures during film deposition or etch is extremely difficult unless that electrode is held at substantially ground potential. Such control is particularly challenging in order to attain the desired accuracies of +/- two degrees for electrodes of up to seven hundred degrees Centigrade.

Accordingly, the prior art recognizes the desirable configuration in which the workpiece is connected to a heated carrier electrode that is grounded; and in which the other electrode is attached to high voltage, e.g., fifty to three-thousand volts, AC or DC.

The prior art further recognizes that the high voltage electrode is conveniently arranged with a plurality of gas outlets extending therethrough so that reactive gases may be injected through the outlets and between the electrodes so as to uniformly distribute gases over the surface of the workpiece. These outlets are thus a series of holes extending through the electrode and connected to the appropriate gas source. In the prior art, the high voltage electrode in this configuration is sometimes referred to a "showerhead" electrode because of its appearance and similarity to a common bathroom showerhead.

The showerhead electrode of the prior art includes an inner mixing region, such as illustrated in FIGS. 1 and 1A. The mixing region is formed within the electrode and between a gas inlet and the several gas outlets. More particularly, the gas inlet leads to an inner volume which facilitates the mixing of gases therein and the distribution of gas from a single inlet to a plurality of outlets. The gases then exit from the inner volume through the outlets for ionization within the gap.

The operation of the prior art reactor with a high voltage showerhead electrode is straightforward. Specifically, the electrodes are energized by the source so that a stable and uniform plasma is created between the two electrodes. A uniform plasma discharge is desirable to achieve uniform plasma etch characteristics and/or the deposition of high-quality, uniform CVD films.

Nevertheless, one problem with the above-described prior art reactor is the generation of undesirable discharges within the showerhead electrode while gas is injected therein. These discharges, for example, are created within the gas inlet which connects between ground and the high potential of the showerhead electrode. Once the reactor is energized, gas molecules which are injected within the inlet are susceptible to ionization by high energy electrons, i.e., those electrons which have sufficient energies to ionize many such gas molecules. This ionization results in plasma which can deposit unwanted films onto reactor surfaces, and which can cause overheating damage to reactor components due to the extreme power densities in reactive plasma.

As illustrated in FIG. 1, the prior art solution to reducing or eliminating unwanted electrical discharges in the gas inlet is to utilize a ceramic (dielectric) RF feedthrough. This solution works on the known principal that high energy electrons cannot ignite a plasma in a gap which is very large as compared to the electron mean-free path. The ceramic feedthrough is large enough to ensure that these electrons lose enough energy through multiple collisions with gas molecules so as to suppress ignition of the gas.

However, typical plasma deposition and etch pressures are between about 0.1 and 10 Torr. For such pressures, reliable discharge suppression can occur only with large, unwieldy, expensive and exposed ceramic feedthroughs, each of which is undesirable for practical and business reasons. Such ceramic feedthroughs are also particularly unsafe for users of the reactor since the feedthroughs function to contain gaseous flows which are toxic, flammable, corrosive, explosive, and otherwise hazardous. Any break in the ceramic feedthrough can introduce reactive gases into the air surrounding the reactor, causing a situation that is dangerous to personnel and the surrounding environment.

It is, accordingly, one object of the invention to provide a high potential showerhead electrode that reduces the problems associated with the prior art.

Another object of the invention is to provide a reactor which enables plasma CVD and/or plasma etch without substantial discharge and ionization in the high voltage electrode.

Yet another object of the invention is to provide process methodology for plasma CVD and/or plasma etch which reduces contamination within the reactor, as compared to the prior art.

Still another object of the invention is to provide a showerhead electrode which reduces unwanted discharges within the gas inlet.

These and other objects of the invention will be apparent from the description which follows.

SUMMARY OF THE INVENTION

In one aspect, the invention provides a reactor for plasma CVD or plasma etch. The reactor has a first electrode held to ground potential which supports the workpiece, e.g., a semiconductor wafer. A second electrode is spaced from the first electrode to form a gap therebetween, and has an electrical potential suitable to form an ionizing electrical field within the gap. The second electrode also has a gas inlet and a gas outlet. Preferably, the gas outlet includes a plurality of gas outlets.

The reactor includes a porous plug constructed and arranged with the gas inlet to isolate the second electrode from ground potential. This plug has a plurality of pores which are sized to permit passage of gas therethrough and to substantially inhibit electrical discharge therein. Accordingly, gas injected through the gas inlet of the second electrode passes through the plug without ionization; and that gas thereafter exits from the gas outlet to provide substantially uniform ionization within the gap.

The reactor of the invention preferably includes a source such as an RF generator connected to the electrodes to generate the electric field selectively. The source can also include circuitry to generate discharges with frequencies between DC and microwave frequencies.

Preferably, in another aspect, the reactor of the invention includes a heater subsystem which controls the temperature of the wafer to between about 200 and 700 degrees Centigrade selectively. The heater subsystem can include, for example, a heating lamp and/or resistive heaters connected to the first electrode.

In still another aspect, the workpiece of the invention is generally one of a semiconductor wafer or flat panel display. However, other workpieces which require plasma CVD and/or plasma etch can be processed in accord with the invention.

In yet another aspect, the first electrode preferably has a surface area, facing the gap, which is sized to between about fifty and two-hundred percent of the surface area of the workpiece. This represents an effective outer limit to the size differential between the areas of the workpiece and the electrode.

Suitable gases, according to the invention, include gases which are suitable for ionization within the electric field. The reactor thus generally has at least one gas selected from the group of ionizable reactant gases, inert support gases, and mixtures thereof.

In still another aspect, the gas outlet preferably includes a plurality of apertures that are spaced substantially equidistantly from any other gas outlet aperture so that gas injected into the gas inlet passes through the outlet apertures in a substantially uniform manner.

In another aspect, the reactor includes a gas source and injection subsystem which generates a gaseous flow through the plug, into the gas inlet, and out of the gas outlets.

In a preferred aspect, the reactor includes a conductive metal mesh arranged adjacent to the plug to inhibit penetration of electric fields into the plug. As used herein, "mesh," "grid" and "screen" are sometimes used interchangeable to denote a conductive fine wire screen that provides high transmission of reactive gases and that substantially prohibits the penetration of ionizing electric fields.

In another aspect, the invention provides a reactor which ionizes two or more gases into a substantially uniform plasma. The reactor includes a first electrode that has substantially ground potential and structure for supporting a workpiece, and a second electrode spaced from the first electrode to form a gap therebetween. The second electrode has a first electrical potential to form an electrical field suitable for ionizing mixed gas within the gap. The second electrode further includes a gas inlet and a gas outlet. Preferably, the gas inlet and outlet, in this aspect, include a plurality of gas inlet and outlet apertures, respectively.

The reactor of this aspect further has a plurality of porous plugs, each plug constructed and associated with a separate gas inlet to isolate the second electrode from ground potential. Each plug has a plurality of pores that are sized to permit passage of gas therethrough and to substantially inhibit electrical discharge therein.

Preferably, an insulator surrounds the porous plugs and insulates the second electrode from ground potential.

The invention also provides, in another aspect, a method of generating plasma in a reactor for plasma CVD or plasma etch, including the steps of: connecting a first electrode to ground potential; spacing a second electrode away from the first electrode to form a gap therebetween, and connecting the second electrode to a first electrical potential to form an electrical field suitable for ionizing gas within the gap. The second electrode in this aspect has a gas inlet and a gas outlet; and a porous plug is inserted into the gas inlet to isolate the second electrode from ground potential. The plug of this aspect has a plurality of pores that are sized to permit passage of gas therethrough and to substantially inhibit electrical discharge therein.

In still another aspect, the invention provides a method of manufacturing a reactor suitable for plasma CVD and plasma etch, including the steps of: spacing a first electrode away from a second electrode to form a gap therebetween, the second electrode having a gas inlet and one or more gas outlets; and filling the gas inlet with a porous plug so as to electrically isolate the second electrode from ground potential, the plug forming a plurality of pores being sized to permit passage of gas therethrough and to substantially inhibit electrical discharge therein.

The invention thus provides several advantages. First, the reactor configuration with the porous plug is much safer than a prior art reactor fitted with an RF ceramic feedthrough since the metal inlet tube, pressurwise connected to the porous plug, is preferably welded to the reactor. Second, the porous plugs reduce the size and complexity of prior art ceramic feedthroughs, and form a sturdier reactor that is less susceptible to damage. Third, the showerhead electrode, according to the invention, provides for gas injection and prohibits plasma formation within a relatively compact space, as compared to the prior art. Fourth, the invention provides for mixing of several gases to facilitate the generation of uniform plasma from the several gases.

These and other aspects and advantages of the invention are evident in the description which follows and in the accompanying drawings.

BRIEF DESCRIPTION OF THE DRAWINGS

A more complete understanding of the invention may be obtained by reference to the drawings, in which.

DETAILED DESCRIPTION OF THE INVENTION

Figure 1:
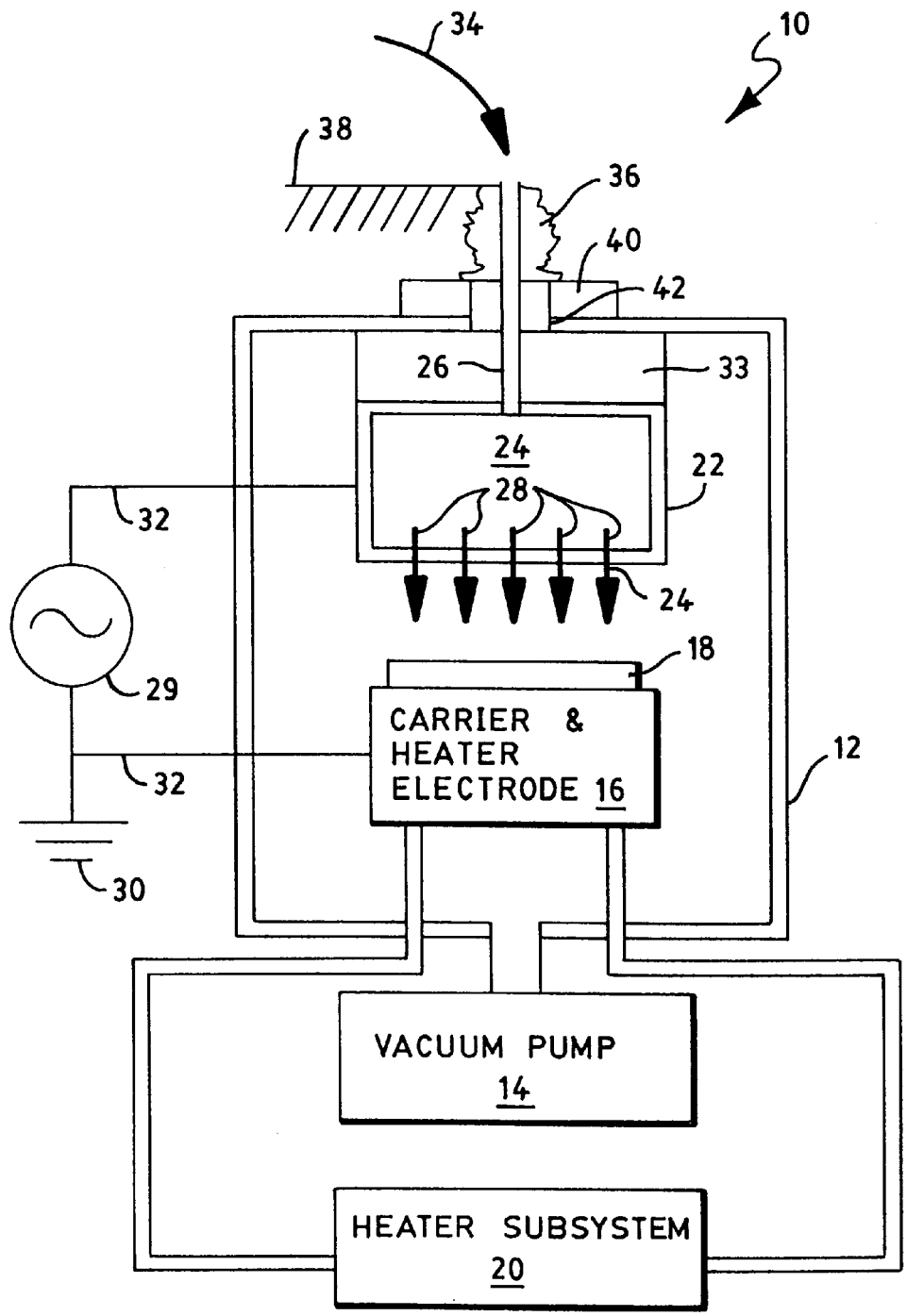
FIG. 1 illustrates a prior art reactor for plasma CVD and/or plasma etch, and further illustrates the prior art solution for reducing unwanted plasma discharges.

FIG. 1 illustrates a prior art reactor 10 that is suitable for use in plasma CVD and plasma etch; and further illustrates the prior art's solution to reducing unwanted discharge and plasma formation. Generally, the reactor 10 includes a housing 12 which can be evacuated through connection with the vacuum pump 14. A carrier electrode 16 supports the workpiece 18, and further supplies selective heating to the workpiece 18 through control of the heating subsystem 20, which operates by one of several techniques known in the art. For example, the heating subsystem 20 can energize a series of resistive heaters (not shown) disposed within the carrier electrode 16.

Figure 1A:
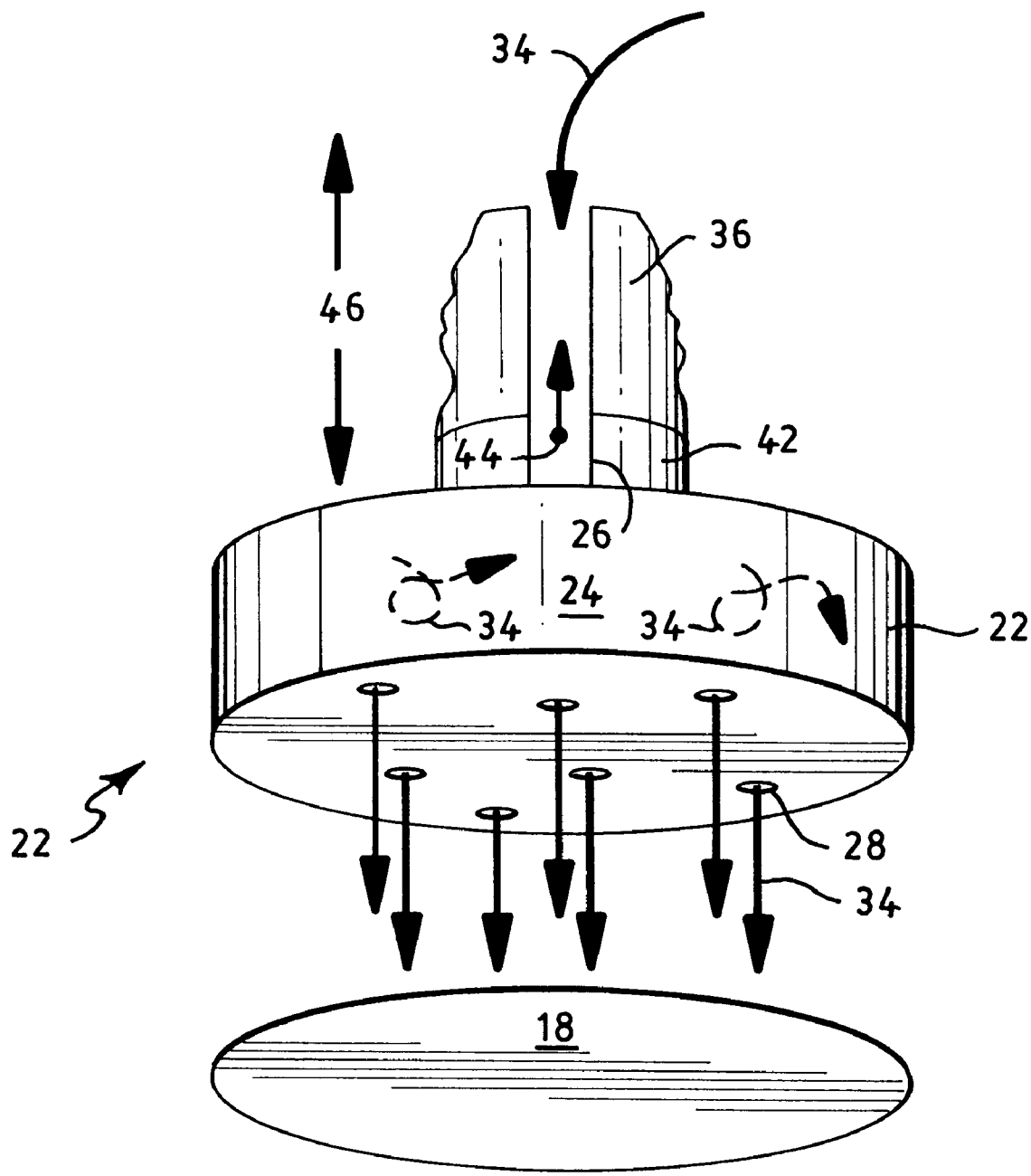
FIG. 1A illustrates a prior art showerhead electrode such as illustrated in FIG. 1.

Electrode 22 is a showerhead-type electrode, shown in more detail in FIG. 1A, which includes an inner mixing region 24, a gas inlet 26, and a series of gas outlets 28. A radiofrequency generator 29 connects to the carrier and showerhead electrodes 16, 22 such that electrode 16 is at ground potential, as illustrated by the electrical ground 30, and such that electrode 22 is at high potential. The, electrical wiring 32 for the generator 29 connects to the electrodes 16, 22 through electrical feedthroughs (not shown) which provide airtight seals through the housing 12.

Because the showerhead electrode 22 is at high potential, it is generally insulated from the rest of the reactor 10. For example, an electrical insulator 33 such as a ceramic or glass material separates the electrode 22 from the housing 12.

In order to inject gas 34 within the reactor 10, the gas inlet 26 must be accessible to regions external to the reactor 10. The gas inlet 26 thus connects to an electrically insulating, ceramic RF feedthrough 36 which is sized so as to ensure that the distance between the inlet 26 (at RF potential) and any point at ground potential, e.g., the surface 38, is large enough to prohibit discharges therebetween. This condition is met at the pressure of operation when the feedthrough dimensions greatly exceed the mean-free path of high energy electrons in the feedthrough. Accordingly, the length of the prior art feedthrough 36 is generally large, and typically extends between about five and twenty centimeters.

With further reference to FIG. 1, connector 40 provides an airtight seal between the inlet 26, the feedthrough 36 and the housing 12. Because the inlet 26 connects directly to the showerhead electrode 22, it is electrically insulated with additional dielectric 42 to further de-couple the inlet 26 from surfaces at ground potential.

FIG. 1A shows a perspective view, partially cut-away, of the showerhead electrode 22 of FIG. 1. FIG. 1A also illustrates the flow of reactive gases 34 through the showerhead electrode 22, and the suppression of discharges within the gas inlet 26. As in FIG. 1, gas 34 is injected through the ceramic feedthrough 36 to provide gas 34 to the reactor 10. The injected gas 34 thereby enters the gas inlet 26 and mixes within the inner region 24. Finally, the gas 34 leaves the showerhead electrode through the plurality of outlets 28 so that the gas is ionized between the two electrodes.

The dimensions of feedthrough 36 are sized so as to ensure that electrons 44 accelerating from the inlet 26 do not discharge to surfaces at ground potential. Instead, the electron energy is dissipated within the length 46 of the feedthrough 36 such that gaseous ignitions are suppressed. High energy electrons thus come to rest before reaching another electrode due to many collisions with gas molecules along the length 46.

The ceramic feedthroughs in the prior art are thus expensive, and have increased cost with larger physical dimensions. They further are exposed relative to the protective regions internal to the reactor 10; and are thus easily damaged. Finally, the ceramic feedthrough 36 extends the overall dimension of the reactor 10 so as to be unwieldy for purposes of transportation and the laboratory space required for operation.

Figure 2:
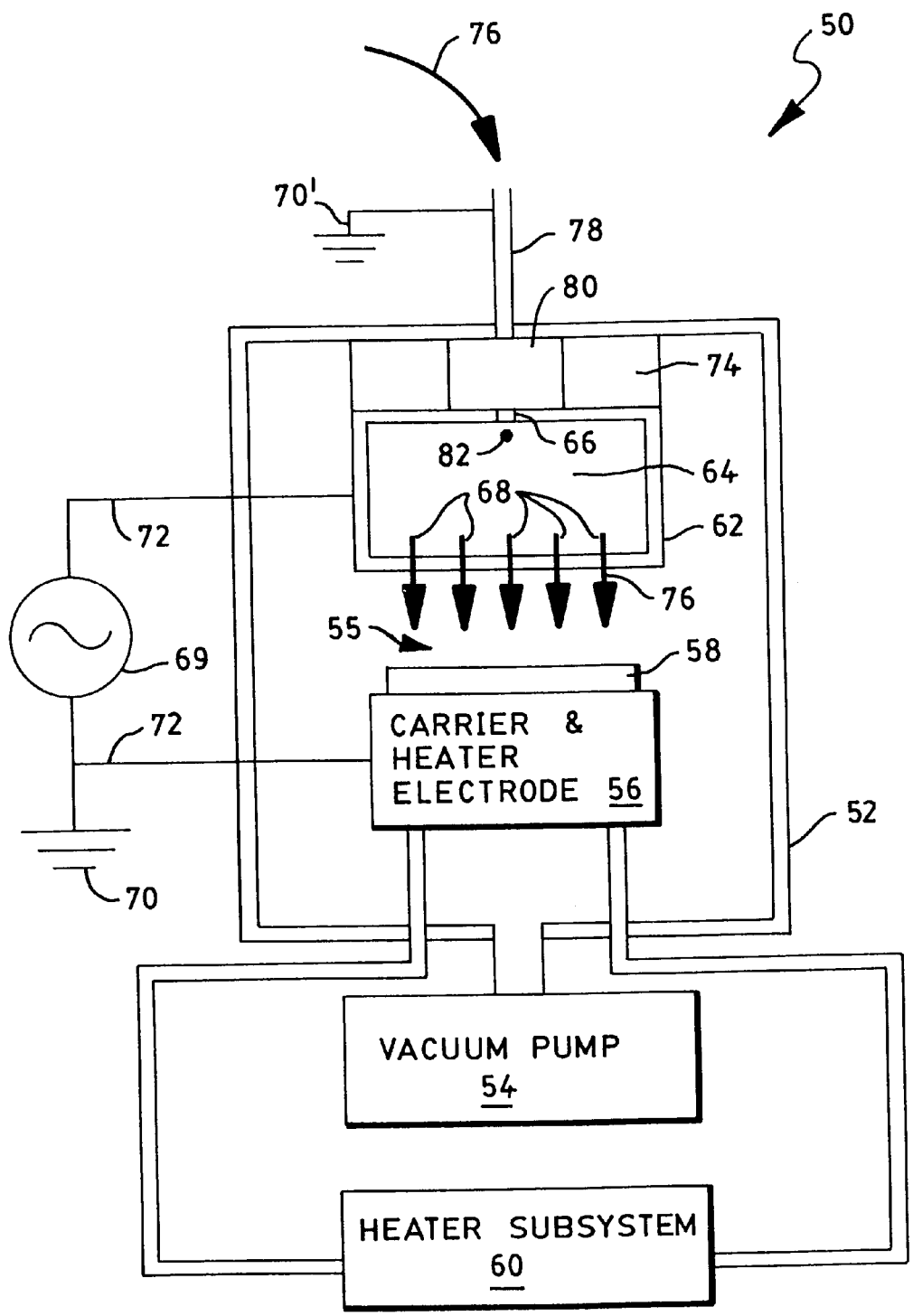
FIG. 2 shows a cross-sectional view of a reactor constructed according to the invention, and further illustrates a showerhead electrode constructed according to the invention which suppresses plasma formation during the introduction of reactive gases to the reactor.

The invention thus alleviates these problems in the prior art by providing a reactor 50 shown in FIG. 2. As in FIG. 1, the reactor 50 generally includes a housing 52 which can be evacuated through connection with the vacuum pump 54. A carrier electrode 56 supports the workpiece 58, and further supplies selective heating to the workpiece 58 through control of the heating subsystem 60, known to those skilled in the art.

The reactor 50 also includes a showerhead electrode 62 that has an inner mixing region 64, a gas inlet 66, and a series of gas outlets 68. A radiofrequency generator 69 connects to the carrier and showerhead electrodes 56, 62 such that electrode 56 is at ground potential, as illustrated by the electrical ground 70, and such that electrode 62 is at high potential. The electrical wiring 72 for the generator 69 connects to the electrodes 56, 62 through electrical feedthroughs (not shown) which provide airtight seals through the housing 52.

Because the showerhead electrode 62 is at high potential, it is preferably insulated from the reactor 50. For example, an electrical insulator 74 such as a ceramic or glass material separates the electrode 62 from the housing 52.

To enable the injection of gas 76 into the reactor 50, the gas inlet 66 connects in fluid communication with a conductive tube 78 through a non-conductive porous plug 80. The tube 78 generally connects to ground potential, as indicated by the ground 70'. Accordingly, the plug 80 provides a break between the high potential of the inlet 66 and ground 70' without permitting discharges therebetween by electrons 82 accelerated to or from the showerhead electrode 62.

The porous plug 80 has many pores extending therethrough. Each pore is sized so as to be very small as compared to the mean free path of the electrons 82 traveling between the showerhead 62 and the ground 70'; and so as to permit the passage of gas molecules therethrough. The electrons 82 thus have a low probability of colliding with the gas molecules so that there is insufficient ionization to sustain discharges. This region of non-ignition between two potentials is sometimes referred to as "dark space" by those skilled in the art.

Preferably, the plug 80 is formed of ceramic material. One suitable manufacturer of the porous plug 80 is Hi-Tech Ceramics, Inc., in Alfred, N.Y., which manufactures the Reticel™ product used primarily as a strainer and/or flow restrictor within casting equipment for the molten metal industry. Suitable ceramic materials include, for example, alumina mullite, lithium aluminum silicate, and mixtures thereof. The diameters of the many pores can be between about 0.2 and 1.7 mm; and the pore density within the plug 80 can be between about 10 to 80 pores-per-inch.

Experimentation with various plug characteristics has proven successful with a ceramic material of 99.5% alumina, pore diameters of between 0.36 and 0.44 mm, and pore densities of between 45 and 65 pores-per-inch. The outer physical dimensions of the plug 80 are adjusted to the particulars of the application. For example, cylindrical plugs with diameters of one centimeter to ten centimeters and thicknesses of one-half centimeter to five centimeters have been successfully tested.

In operation, the pores within the porous plug 80 provide a dense and interconnected passageway for the passage of gas molecules therethrough. Unlike electrons, the gas molecules pass through the maze of interconnected pores to penetrate through the plug, thereby passing from the metal tube 78 to the inlet 66. The porous plug 80 does, however, induce a controllable pressure drop across the plug 80 which functionally depends upon gas flow rate, pore size, and pore density.

Unlike the above-described gas molecules, plasma cannot penetrate the porous plug 80 even though an electric field can, e.g., the field created between the inlet 66 and tube 78. Electrons which are formed in or by the plug and which are accelerated by the field will strike the wall of a pore before ionization can occur, preventing unwanted discharges.

The gap 55 between the electrodes 56 and 62 is generally between about 5 and 50 mm. Preferably, the gap 55 is between about 10 and 30 mm.

Figure 3:
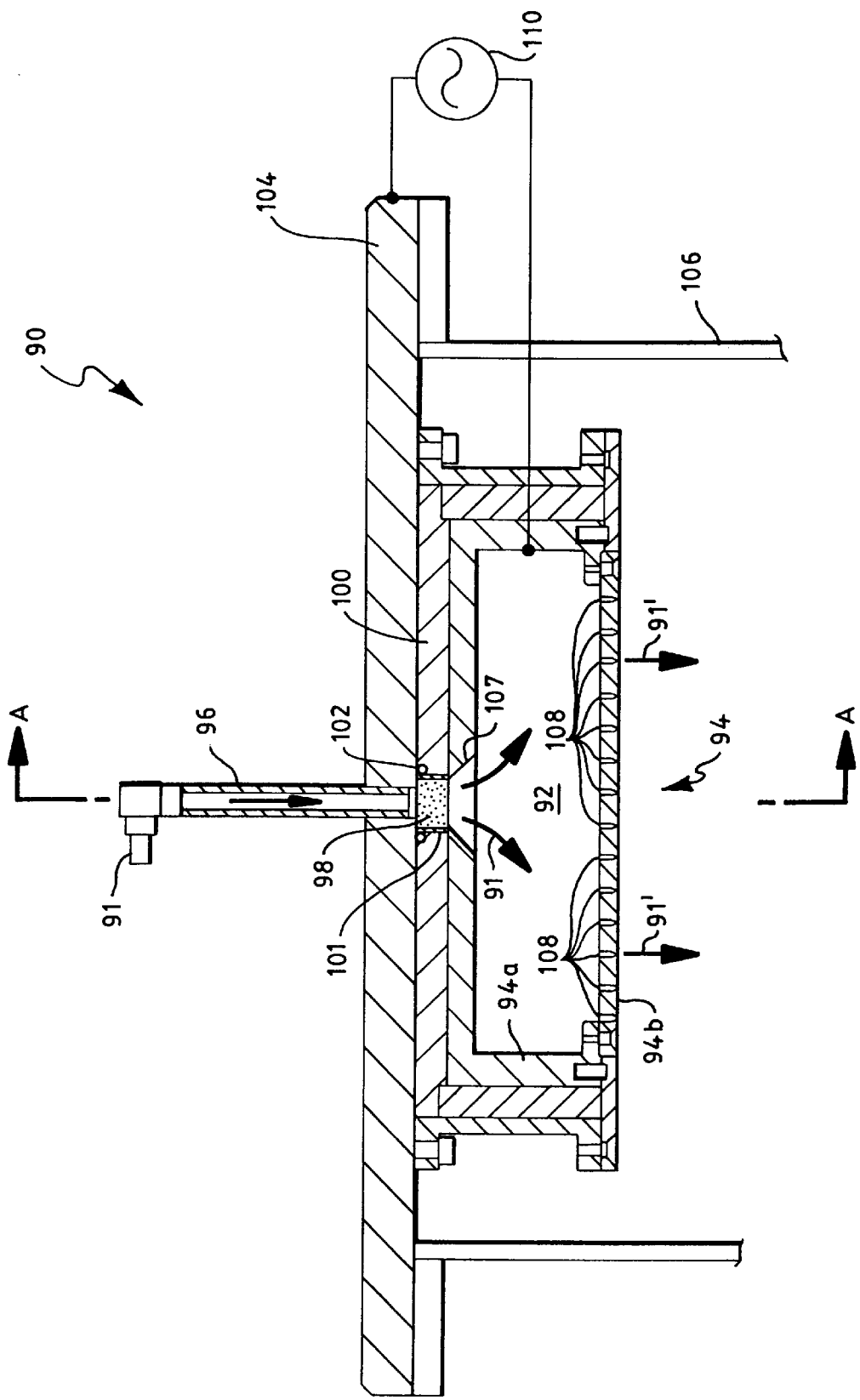
FIG. 3 shows a cross-sectional view of a portion of reactor constructed according to the invention and illustrating a single-gas input showerhead electrode constructed according to the invention.

FIG. 3 shows a portion 90 of a reactor constructed according to the invention. A single gas 91 is introduced into the mixing region 92 of the showerhead electrode 94 through the metal tube 96 and through a cylindrical porous plug 98 inserted into a boron nitride insulating disc 100. An O-ring 102 prevents leakage of the gas between the boron nitride disc 100 and the cover plate 104. The plug 98 is preferably held within a ceramic sleeve 101 for purposes of insulation, support, and manufacturability.

Those skilled in the art should understand that the partial, cross-sectional view of a reactor in FIG. 3 is shown for clarity of illustration; and that the cover plate 104 and reactor walls 106 form, in combination, a reactor housing such as the housing 52 of FIG. 2.

Unlike the showerhead electrode 62 of FIG. 2, the electrode 94 of FIG. 3 is constructed with several components for ease of manufacturing. For example, the electrode 94 includes a showerhead can 94a, which is machined to include a gas inlet 107, and a showerhead plate 94b. The plate 94b includes a plurality of gas outlets 108 extending therethrough so as to uniformly distribute gas 91' out of the showerhead 94.

A radiofrequency generator 110 is illustratively shown in FIG. 3 as being connected between the negative potential of the showerhead electrode 94 and cover plate 104, representative of ground. Those skilled in the art should understand that the generator 110 is illustrative, and should not be considered limiting. For example, another suitable generator according to the invention is one which generates differential voltages between the electrodes at microwave frequencies. DC voltage is also suitable according to the invention.

Those skilled in the art should also understand that the reactors for plasma CVD and etch are substantially rectangular for Flat Panel Display, and substantially cylindrical for semiconductor wafers. Therefore, each of the illustrated cross-sectional views of FIGS. 1–3, for example, are substantially the same in the cross-sectional axis which is perpendicular to the illustrated axis. By way of example, a cross-sectional view "A" of the reactor portion 90, FIG. 3, would yield a substantially similar cross-sectional view as shown in FIG. 3.

FIG. 3 also illustrates certain advantages over the prior art. In addition to suppressing discharges in the gas inlet 107 and tube 96, the combination of the inlet 107, tube 96, and porous plug 98 is relatively compact as compared to the prior art combination of the inlet 26, insulator 42, and ceramic feedthrough 36. This compactness thus saves costs, and completely removes the risks associated with damaging an expensive ceramic feedthrough since such a feedthrough does not exist within the reactors of FIGS. 2 and 3.

Figure 3A:
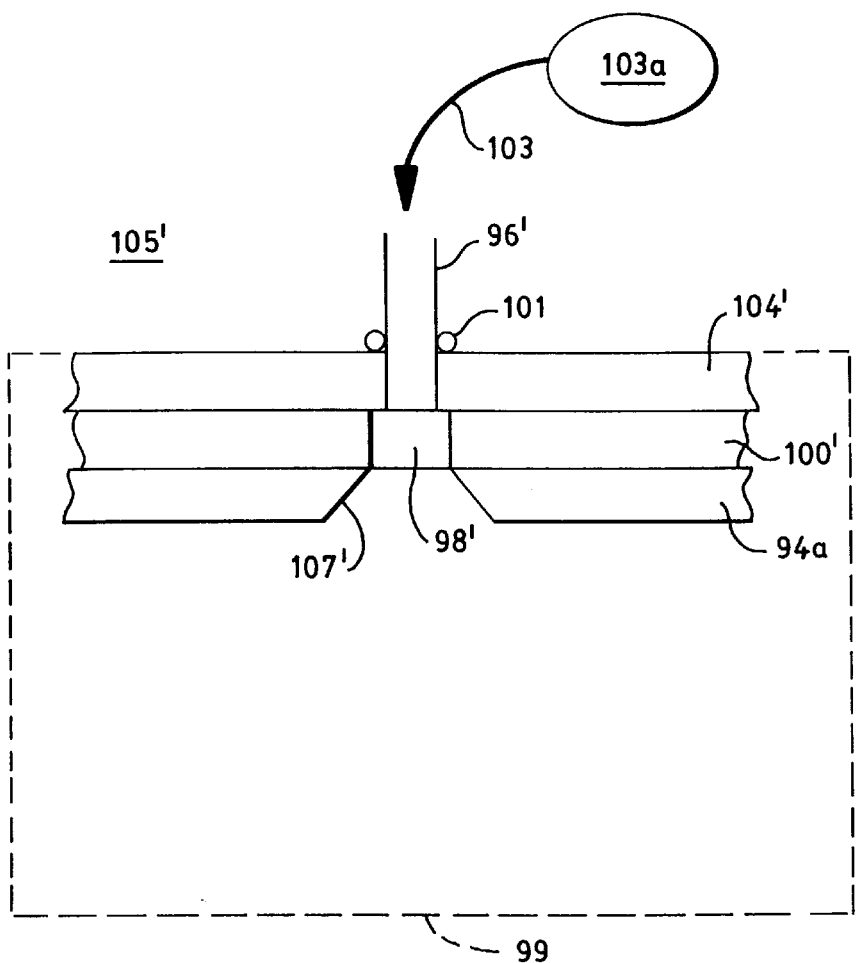
FIG. 3A illustrates certain safety features of the connection between high potential and ground which facilitates the flow of reactive gases therethrough, in accord with the invention.

FIG. 3A illustrates one particular advantage over the prior art. Particularly, FIG. 3A shows greater detail of a metal tube 96' connected pressurewise to a porous plug 98' in accord with the invention. Unlike the prior art, such as shown in FIGS. 1 and 1A, the break between high potential and ground occurs at the plug 98' and within the reactor body, here shown as outline 99. That is, the plug 98' is mounted within the insulator 100' and below the tube 96', which is welded, via weld joints 101, directly to the cover 104' to provide a very sturdy connection for the introduction of gases 103 into the reactor 99 by the gas supply/generator 103a. As such, the configuration of FIG. 3A is much safer than the ceramic feedthroughs of the prior art since there is little likelihood of breaking the gas flow connection between the inlet 107' within the showerhead can 94a and regions 105' outside the reactor 99. The metal tube 96' can thus be considered a "mixing tube" as multiple gases injected through the inlet and into the plug 98' are mixed within the plug 98'. The mixing tube 96' can further include a plurality of conduits such as shown in FIGS. 4 and 4A.

Those skilled in the art should appreciate that the tube 96' of FIG. 3A can alternatively be connected to a flange bolted to the reactor 99 via a metalized vacuum seal; and that such a configuration provides a similar break between high potential and ground as provided for by the scope of the invention.

Figure 4:
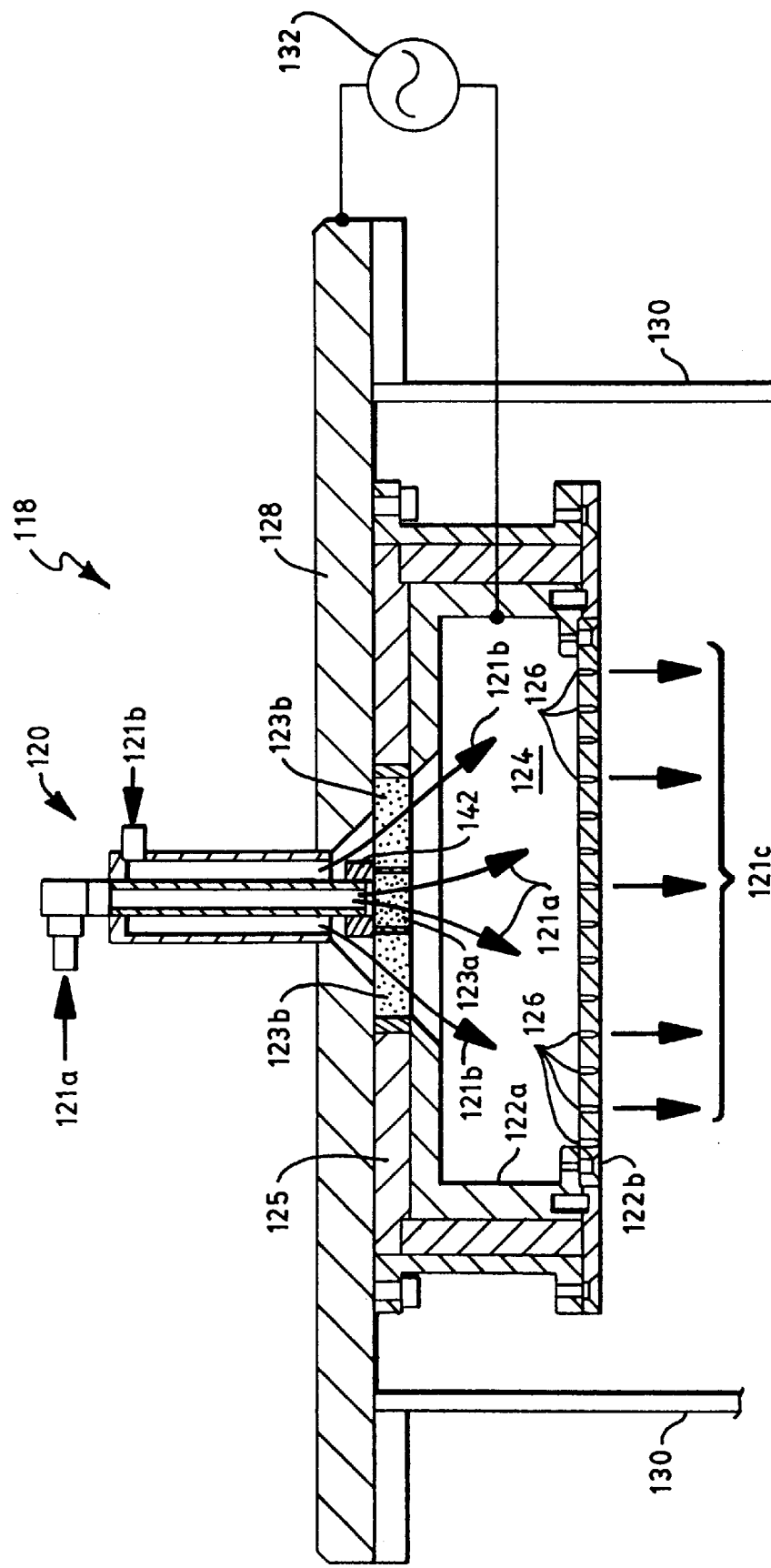
FIG. 4 shows a cross-sectional view of a portion of reactor constructed according to the invention and illustrating a multiple-gas input showerhead electrode constructed according to the invention.
Figure 4A:
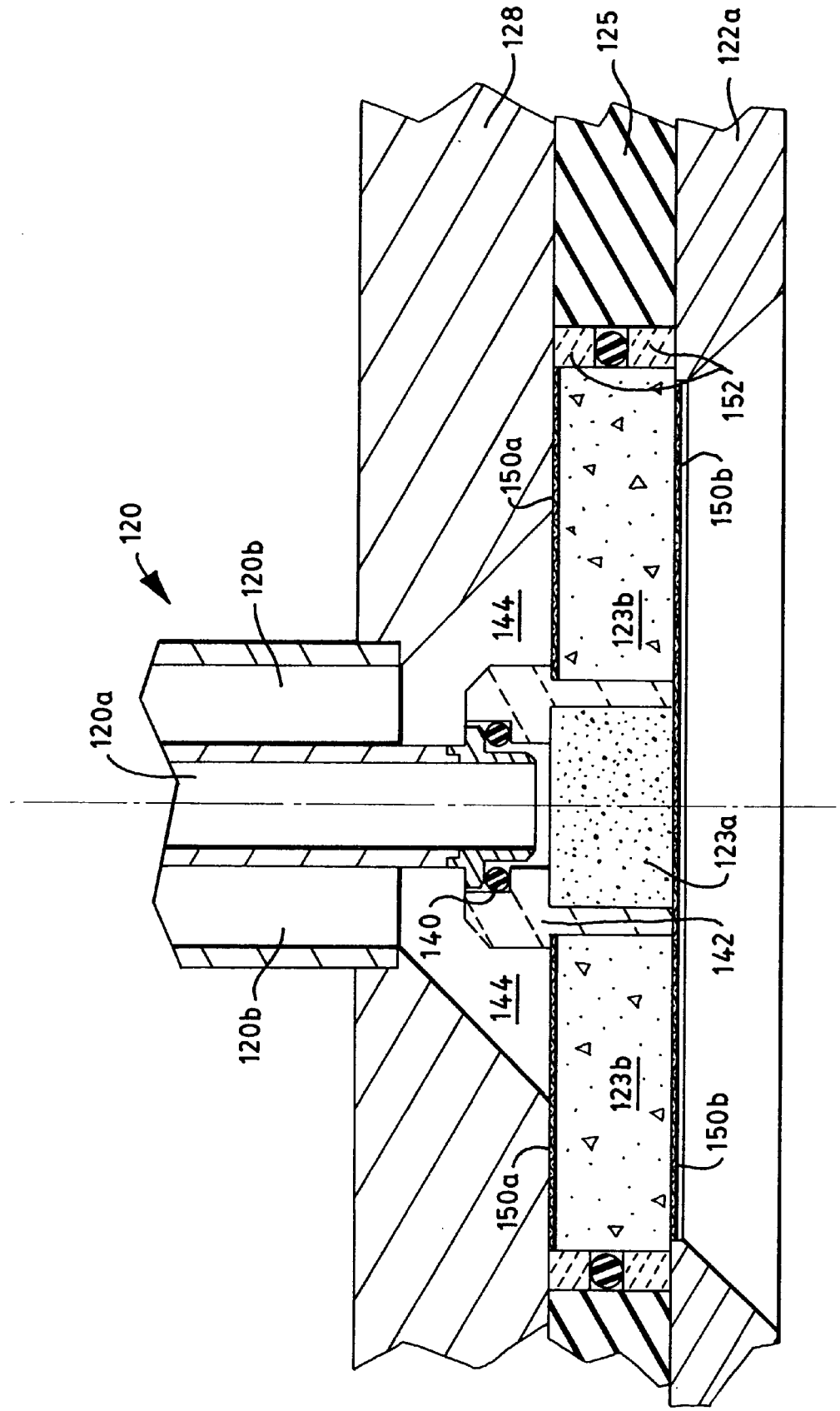
FIG. 4A illustrates greater detail of the showerhead electrode of FIG. 4.

In an alternative embodiment of the invention, several gases can be simultaneously injected and mixed within a reactor constructed according to the invention, such as illustrated in FIG. 4. Specifically, FIG. 4 shows a portion 118 of a reactor which includes a two-input gas tube 120 that connects to two separate porous plugs 123a, 123b. The plugs 123a, 123b permit the concentric introduction of two gases 121a, 121b into the reactor at the center of the showerhead can 122a. These gases 121a, 121b are effectively mixed within the mixing region 124 so that a combination gas 121c exits through the outlets 126 and from the showerhead plate 122b. As in FIG. 3, the plugs 123a, 123b are preferably held within an insulating ceramic sleeve 142 that is inserted into an insulating disc, e.g., the boron nitride insulator 125.

As above, those skilled in the art will appreciate that the portion 118 of a reactor is shown for clarity of illustration; and that the cover 128 and reactor walls 130 combine with other structure (not shown) to provide a complete reactor such as shown in FIG. 2.

The reactor portion 118 illustrated in FIG. 4 is typically driven by an RF generator 132 which connects to high potential, i.e., the showerhead electrode 122, and to ground, illustratively shown as the cover plate 128.

FIG. 4A shows greater detail of selected portions of the reactor of FIG. 4. Specifically, FIG. 4A shows how the two-input gas tube 120 connects to the porous plugs 123a, 123b. The central gas tube 120a is concentrically surrounded by tube 120b. Tube 120a connects directly above plug 123a through an O-ring connection 140 and ceramic sleeve 142. Tube 120b, on the other hand, connects to the annular-shaped plug 123b through a conduit 144 that is within the cover plate 128 and that surrounds the sleeve 142.

FIG. 4A also illustrates additional desirable structure which facilitates the successful operation of the reactor. For example, FIG. 4A illustrates metal grids 150 and ceramic support rings 152 which are generally too small for illustration within FIG. 4. The metal grids 150 help prevent the penetration of electric fields through the porous plugs 123a, 123b. More particularly, because the plugs 123a, 123b are insulators, the electric field between the showerhead electrode 122 and gas tube 120 can penetrate the plugs 123a, 123b when their diameters are much greater than their respective thicknesses. This electric field penetration is undesirable since the field can generate plasma discharges within the tube 120.

However, such an electric field cannot penetrate the conductive metal grid 150. As shown, FIG. 4A includes two separate grids 150a, 150b separated by insulating ceramic support rings 152. Grid 150a is thus at ground potential; while grid 150b is at the potential of the generator driving the showerhead electrode 122. The grids 150a, 150b thus prevent electric field penetration into the porous plugs 123a, 123b; but permit high permeability of gas molecules, e.g., greater than abut 70% throughput. One suitable manufacture of the grids 150a, 150b is provided by Cleveland Wire Cloth Mfg. Co., in Cleveland, Ohio.

The reactor of FIGS. 4 and 4A is particularly useful for introducing two reactive gases with differing flow rates and pressures: that is, one gas 121a can have a low vapor pressure and a low flow rate; while the other gas 121b can have a high vapor pressure and a high flow rate. The two gases 121a, 121b are passed through the separate tubes 120a, 120b, respectively, and separate porous plugs 123a, 123b, respectively, so that desired mixing characteristics are achieved. For example, the plugs 123a, 123b can be selected with differing pore densities to suit or match the pressure and flow rate of the respective gases 121a, 121b. The ceramic sleeve 142 and O-ring facilitate the introduction of gases with separate inlet pressures prior to mixing within the mixing region 124 of the showerhead electrode.

The invention thus attains the objects set forth above, among those apparent from preceding description. Since certain changes may be made in the above apparatus and methods without departing from the scope of the invention, it is intended that all matter contained in the above description or shown in the accompanying drawing be interpreted as illustrative and not in a limiting sense.

Figure 5:
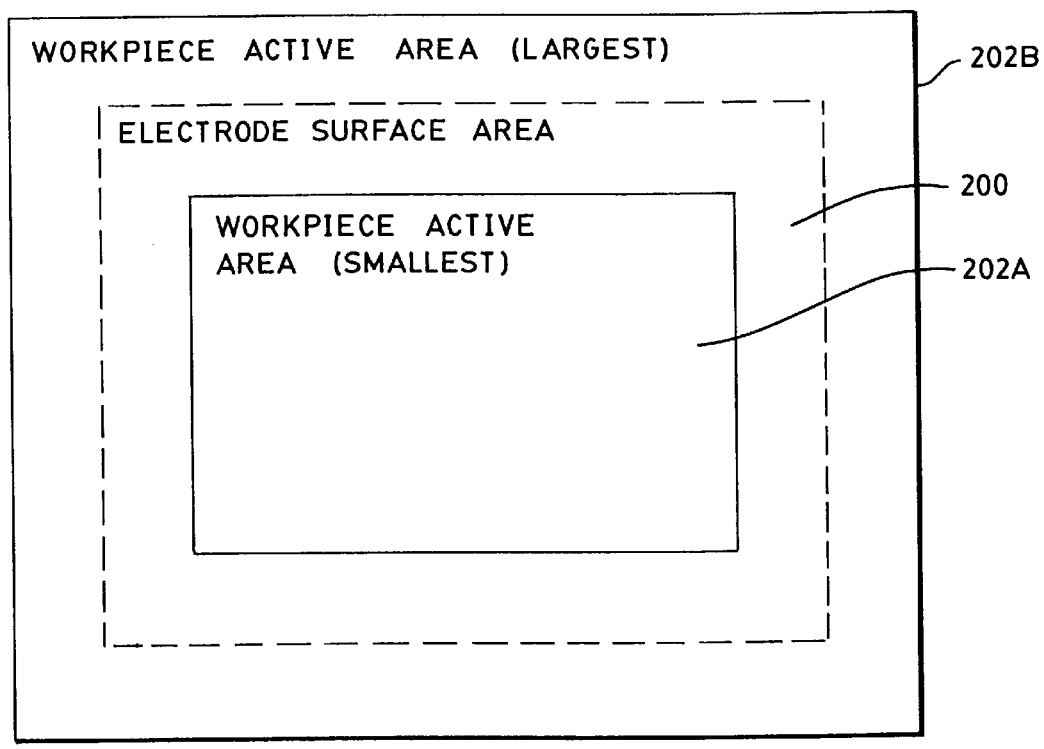
FIG. 5 illustrates representative sizes between the active area of the workpiece and the reactor electrode surface area, in accord with the invention.

For example, the workpieces described herein can include Flat Panel Displays and semiconductor wafers. Typically, Flat Panel Displays are rectangular. In FIG. 5, for example, it should be clear to those skilled in the art that the physical relationship between the surface area 200 of the first electrode representative of ground potential, e.g., the electrode 56 of FIG. 2, and the active area 202 of the workpiece, e.g., the workpiece 58 of FIG. 2, is adjustable according to the needs of the manufacturer. Typically, however, the active area 202 of the workpiece is between about one-half to two times the surface area 200: specifically, outline 202A illustrates the former and outline 202B illustrates the latter.

It is also to be understood that the following claims are to cover all generic and specific features of the invention described herein, and all statements of the scope of the invention which, as a matter of language, might be said to fall there between.

Having described the invention, what is claimed as new and secured by Letters Patent is:

1. A reactor for ionizing two or more gases into a substantially uniform plasma, comprising:
 (A) a first electrode having substantially ground potential and means for supporting a workpiece;
 (B) a second electrode spaced from the first electrode to form a gap therebetween and having a first electrical potential to form an electrical field suitable for ionizing mixed gas within the gap; the second electrode having a plurality of gas inlets and a gas outlet;
 (C) a plurality of porous plugs, each porous plug constructed and associated with a separate gas inlet to isolate the second electrode from ground potential, each plug forming a plurality of pores and being sized to permit passage of gas therethrough and to substantially inhibit electrical discharge therein; and
 (D) an insulator, surrounding the porous plugs and insulating the second electrode from ground potential.

2. A reactor according to claim 1, wherein the gas outlet comprises a plurality of gas outlet apertures.

3. A reactor according to claim 1, wherein the gas outlet apertures are sized so as to create a pressure difference between the gap and a volume inside the second electrode.

4. A reactor according to claim 1, further comprising a plurality of ceramic sleeves, each sleeve separating a porous plug from the insulator to provide support between the plugs and the insulator.

5. A reactor according to claim 1, further comprising a first conductive metal mesh adjacent a first side of the plugs, the first mesh having ground potential, and a second conductive metal mesh adjacent a second side of the plugs, the second mesh being at the first potential, the first and second meshes inhibiting penetration of electric fields into the plugs and providing permeability to gases.

* * * * *